US006157185A

United States Patent [19]

Stone et al.

[11] Patent Number: 6,157,185

[45] Date of Patent: Dec. 5, 2000

[54] MILTIPLE BUS SWITCHING AND TESTING SYSTEM

[75] Inventors: James R. Stone, Lake Tapawingo; Ralph Taylor, Lee's Summit, both of Mo.

[73] Assignee: Dit-Mco International, Kansas City, Miss.

[21] Appl. No.: 08/948,007

[22] Filed: Oct. 8, 1997

[51] Int. Cl.[7] .................................................... G01R 31/28

[52] U.S. Cl. ........................................ 324/158.1; 324/765

[58] Field of Search ................................ 324/158.1, 754, 324/763, 765

[56] References Cited

U.S. PATENT DOCUMENTS

| | | | |
|---|---|---|---|
| 4,746,855 | 5/1988 | Wrinn | 324/763 |
| 4,956,602 | 9/1990 | Parrish | 324/754 |
| 5,389,556 | 2/1995 | Rostoker et al. | 324/765 |
| 5,506,510 | 4/1996 | Blumenau | 324/754 |
| 5,736,850 | 4/1998 | Legal | 324/158.1 |

*Primary Examiner*—Ernest Karlsen
*Attorney, Agent, or Firm*—Shook, Hardy & Bacon, LLP

[57] ABSTRACT

A modular switching and testing system using multiple buses for testing electrical equipment. A switch module selectively switches the test points of the equipment under test to connection with the buses. A routing matrix switches power supplies and instrumentation to the selected buses. Expansion of the system in the field is possible by adding individual circuit boards to provide more termination points or by adding switching modules to provide additional buses.

4 Claims, 4 Drawing Sheets

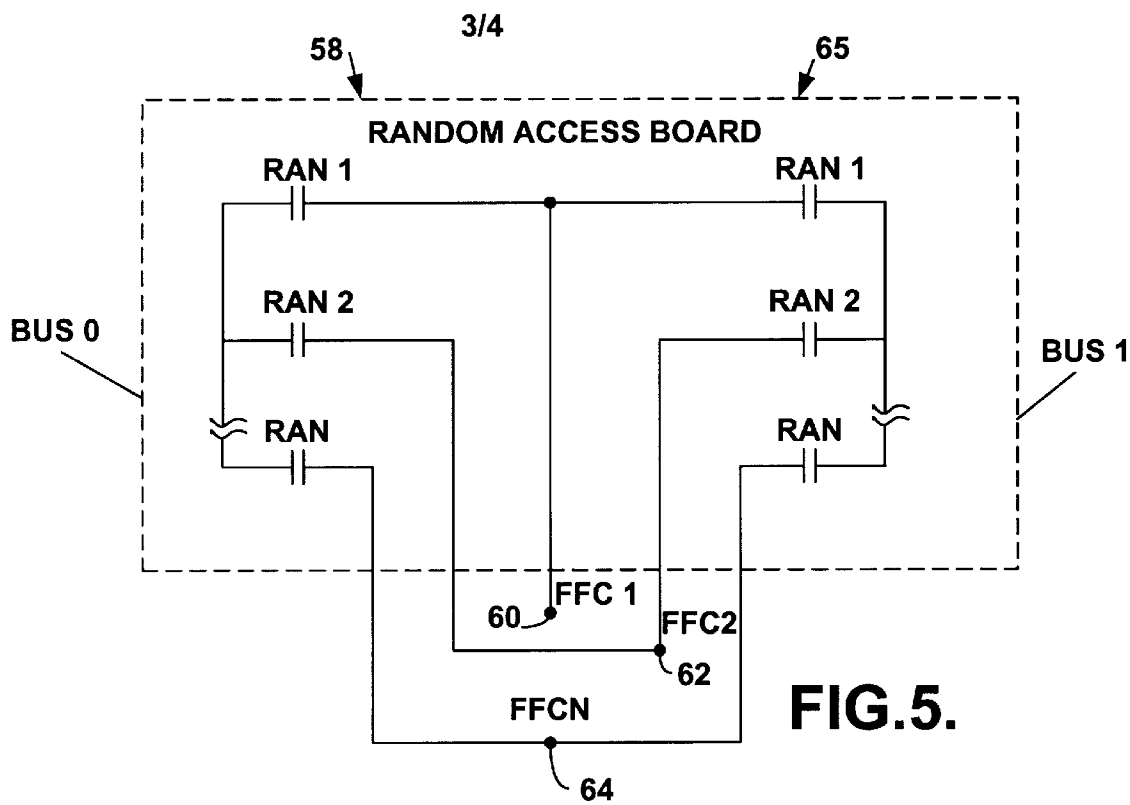
FIG.5.
FIG.6.
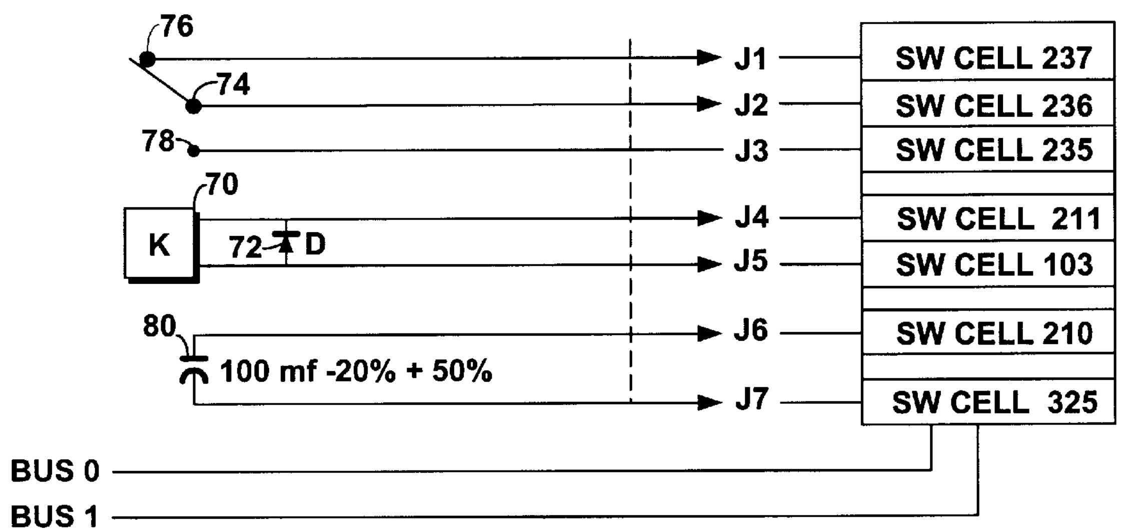

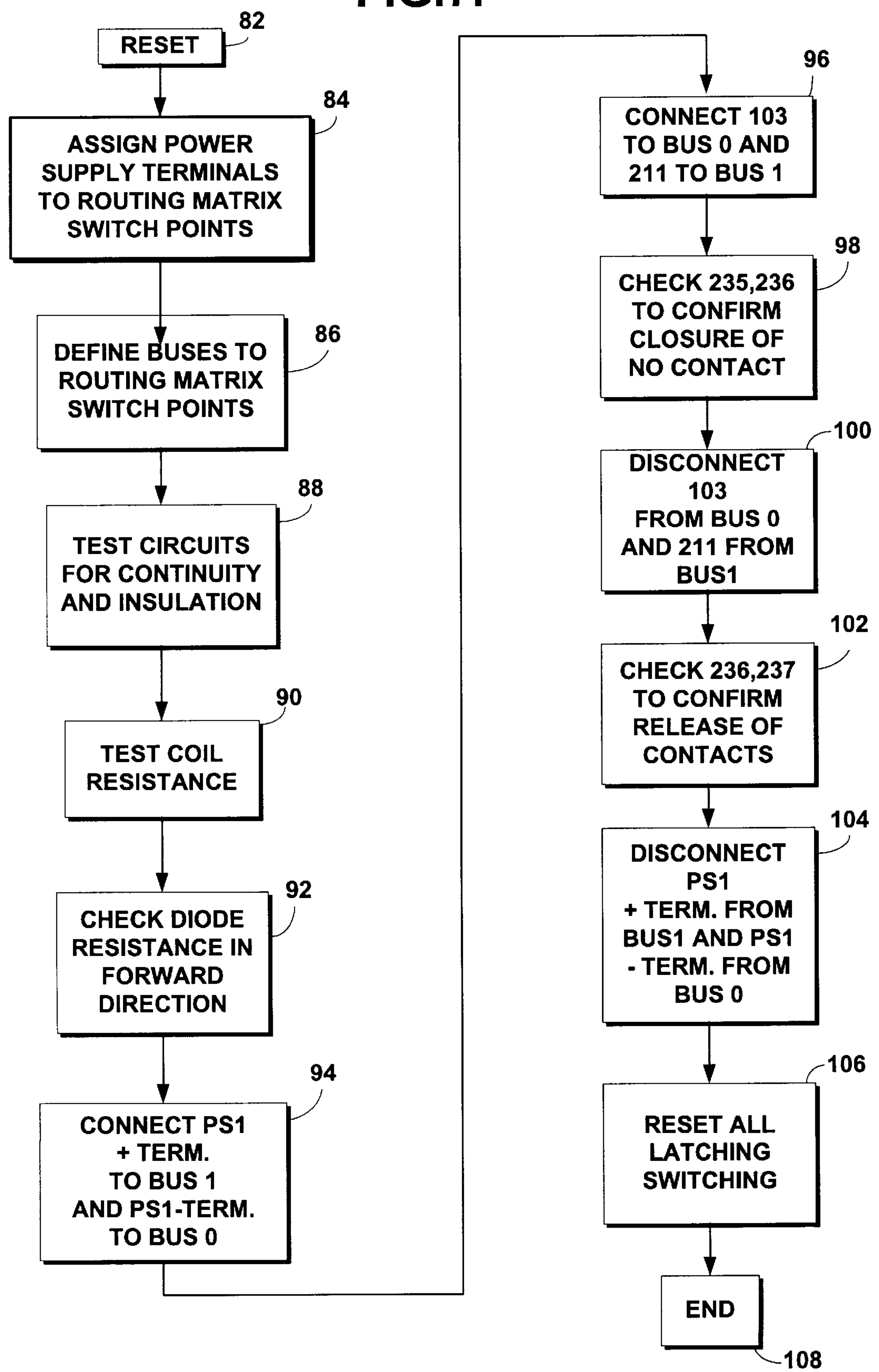
FIG.7.
RESET
82
ASSIGN POWER SUPPLY TERMINALS TO ROUTING MATRIX SWITCH POINTS
84
DEFINE BUSES TO ROUTING MATRIX SWITCH POINTS
86
TEST CIRCUITS FOR CONTINUITY AND INSULATION
88
TEST COIL RESISTANCE
90
CHECK DIODE RESISTANCE IN FORWARD DIRECTION
92
CONNECT PS1 + TERM. TO BUS 1 AND PS1-TERM. TO BUS 0
94
CONNECT 103 TO BUS 0 AND 211 TO BUS 1
96
CHECK 235,236 TO CONFIRM CLOSURE OF NO CONTACT
98
DISCONNECT 103 FROM BUS 0 AND 211 FROM BUS1
100
CHECK 236,237 TO CONFIRM RELEASE OF CONTACTS
102
DISCONNECT PS1 + TERM. FROM BUS1 AND PS1 - TERM. FROM BUS 0
104
RESET ALL LATCHING SWITCHING
106
END
108

MILTIPLE BUS SWITCHING AND TESTING SYSTEM

FIELD OF THE INVENTION

This invention relates generally to electrical test equipment and deals more particularly with a switching system which uses multiple buses to provide for connection of power supplies and instrumentation to test points on electrical equipment that is to be tested.

BACKGROUND OF THE INVENTION

Relay panels, chassis for electrical equipment, and a variety of other complicated electrical devices must be tested to confirm that the relays function properly and that other electrical properties such as continuity and insulation are proper. Special problems can be encountered in connection with the testing of relays for open circuits and short circuits. To test for proper relay operation, an external power supply must be connected to the relay coil, and resistance measurements or other measurements of the relay contacts must be taken to confirm that the contacts open and close properly.

The traditional approach to relay testing makes use of an external energization matrix to actuate the relay. An interface cable extending from the test equipment to the unit under test must be split into two branches in order to provide the necessary connections to the test point matrix and the external energization matrix. Because of the need for a split cable, the interface cable must be specially constructed in a manner making it useful only for one particular product. The need for a different special cable for each product leads to excessive cable requirements and high overall cable costs. If a product has a design change involving moving or adding relays, a new interface cable is required. This further complicates the cable requirements and aggravates the cost problem. All of these problems are increased when the number of relays in the product increases.

SUMMARY OF THE INVENTION

The present invention is directed to a switching system which makes use of multiple buses to provide access to each test point from power sources and/or instruments without requiring special cables. The switching system is also characterized by a modular construction which allows it to be custom tailored to each individual situation while also accommodating expansion in the field if necessary.

In accordance with the invention, a switching module used with test equipment includes up to ten switching boards, each of which has 100 terminations that can be connected with test points of a unit under test. Therefore, the module can provide 1000 test points if necessary. Multiple buses which connect with the switching module can be selectively connected through a latching matrix with power supplies and instrumentation such as volt meters or other types of measurement devices. Under program control, each power supply and each instrument can be connected through the latching matrix and the switching module with any of the test points. Thus, truly universal access is provided. At the same time, standard interface cables can be used to connect the front face connections of the switching module with the test points, and there is no need for specialized split cables.

The modular construction of the switching system allows expansion as necessary, either by adding circuit boards to the module if more front face connections are needed or by adding switching modules if more buses are needed, such as when there is a need for more power supplies or more instrumentation. The addition of slave modules provides added buses so that more power supplies or instruments can be switched to the added buses to provide access to them by the unit under test. The modular construction, both at the circuit board level and module level, allows a system to be constructed that meets the specific needs of each testing situation, and it readily accommodates expansion in the field as the needs increase or change.

BRIEF DESCRIPTION OF THE DRAWINGS

In the accompanying drawings which form a part of the specification and are to be read in conjunction therewith and in which like reference numerals are used to indicate like parts in the various views:

FIG. 5 is a diagrammatic view of one of the random access boards of a switching module included in the switching and testing system;

FIG. 6 is a schematic circuit diagram of a relay that may be tested using the switching and testing system of the present invention; and FIG. 7 is a simplified flow diagram of software that may be used for testing of the relay shown in FIG. 6 in accordance with the switching and testing system of the present invention.

DETAILED DESCRIPTION OF THE INVENTION

Figure 1:
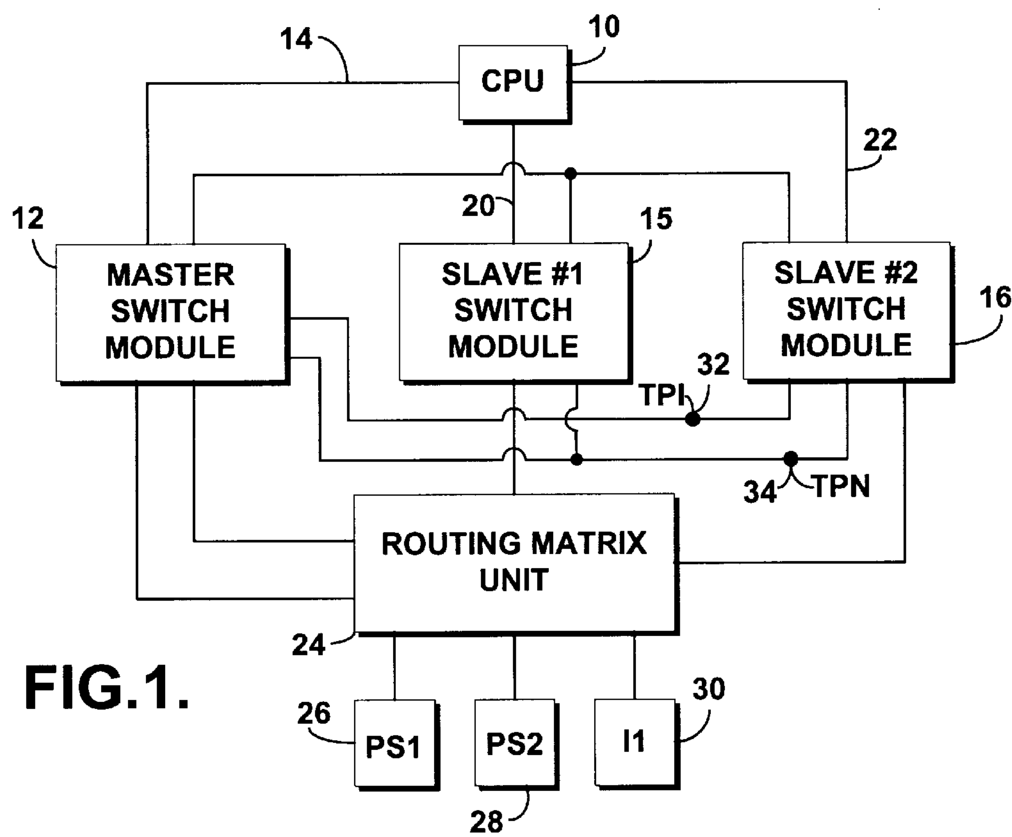
FIG. 1 is a block diagram depicting the general components of a multiple bus switching and testing system constructed according to a preferred embodiment of the present invention.

Referring now to the drawings in more detail and initially to FIG. 1, the present invention is directed to a multiple bus switching and testing system which is used in connection with electrical testing equipment to test electrical systems such as relay panels and the like. The switching and testing system includes a central processing unit 10 which may be a personal computer or another programmable machine suitable for carrying out the control and communication functions that are necessary for operation of the switching and testing system.

A master switch module 12 includes a plurality of relay switches used in the testing procedure. The master switch module 12 is controlled by the central processing unit 10, as indicated by the control line 14. The switching and testing system may also include additional switch modules 15 and 16 which are respectively referred to as slave number 1 and slave number 2 modules. If the modules 15 and/or 16 are used, they are connected with the master switch module 12 by means of line 18. Line 20 connects the CPU 10 with module 15, while another line 22 connects the CPU 10 with switch module 16.

A routing matrix unit 24 included in the system includes a switching matrix used to connect power supplies, such as the power supplies 26 and 28, and instrumentation, such as the instrument 30, with the switch modules 12, 15 and 16. Under program control, the routing matrix unit 24 is placed in the proper switch condition so that the power supplies 26 and 28 and the instrument 30 are connected with the appropriate buses, as will be explained more fully.

The switch modules connect with a number of test points on the equipment that is being tested. For example, a test point 32 is indicated in FIG. 1 and identified as TP1 or test point 1. Another test point 34 is identified as TPN or test point number N. The switch modules are typically capable of providing 1000 test points, so the number N may be as high as 1000. It is further noted that all of the switch modules 12, 15 and 16 do not always connect with all of the test points, so the number N may be well in excess of 1000 in many applications.

Figure 2:
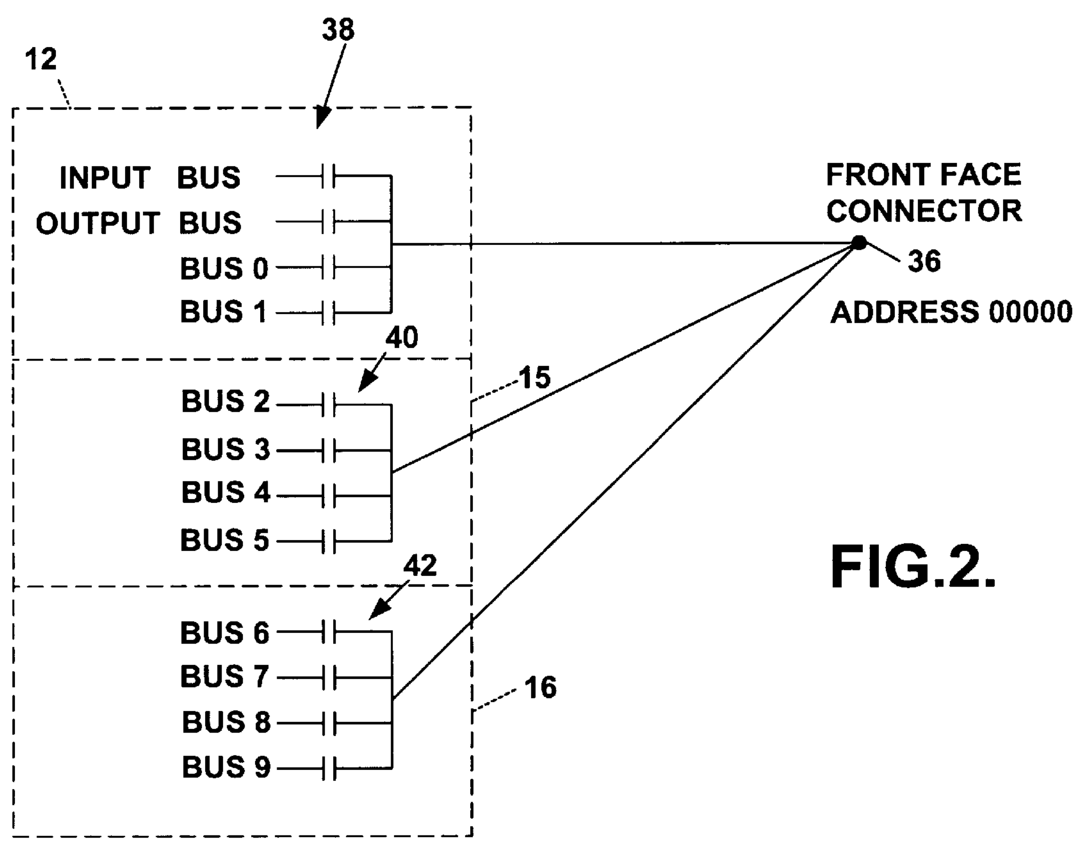
FIG. 2 is a diagrammatic view of three of the switching modules of the switching and testing system and indicating diagrammatically how a selected front face connector of the test equipment can be connected with any of the buses in the switching and testing system.

Referring now particularly to FIG. 2, the master switch module 12 has four buses, including input and output buses and two additional buses identified as bus 0 and bus 1. The system has a large number of front face connectors, such as the front face connector 36 shown in FIG. 2. In some applications, there may be as many as 5000 front face connectors 36, and they are used as connection points for connecting the switching and testing system with the test points of the equipment that is being tested. As shown in FIG. 2, the face connector 36 may be selectively connected with the input and output buses and buses 0 and 1 by closing of the proper relay contacts of the master switch module which are collectively identified by numeral 38. The input and output buses are standard buses that are used with standard instrumentation to carry out various electrical tests. The other two buses, buses 0 and 1, can be used to provide various functions that may be required for the testing that is being carried out.

The first slave switch module 15 similarly has four buses identified as buses 2, 3, 4 and 5. Again, relay contacts collectively identified at 40 may be selectively operated to connect one or these buses with the front face connector 36. The second slave switch module 16 provides buses 6, 7, 8 and 9. Relay contacts collectively identified by numeral 42 may be selectively used to connect any of these buses with the front face connector 36.

It is to be noted that the switch modules have similar switching connections with the remaining front face connectors which are assigned different addresses so that the programming can select the address to which each bus is to be connected. It is further to be noted that all of the buses may not need to be connected with all of the front face connectors because all of the test points may not require multiple bus connections. For example, a typical system might consist of 2000 test points overall with only 1000 of these points being connected with multiple buses.

Figure 3:
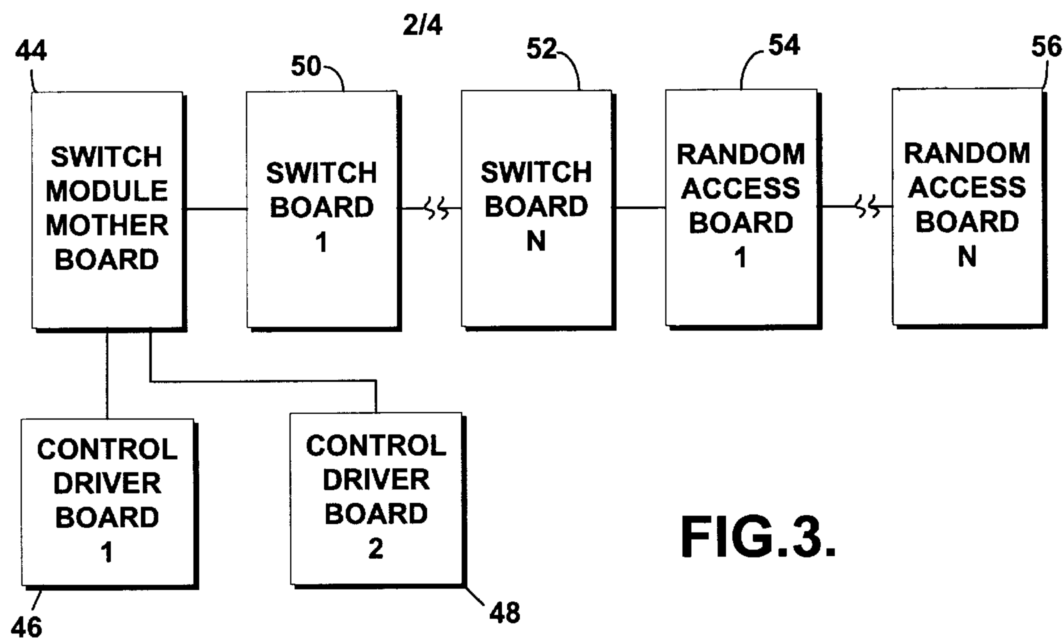
FIG. 3 is a diagrammatic view of the circuit boards that may be included in the master switch module of the switching and testing system.

FIG. 3 shows an exemplary construction of one of the switching modules. A motherboard 44 is included and may be connected with two control driver boards 46 and 48 which serve to provide a suitable interface with the central processing unit 10. A switching board 50 having 100 terminal points may be plugged directly into the motherboard 44. Additional switch boards such as the switch board 52 may be connected in piggyback fashion with the first switch board 50. The switch board 52 is identified as switchboard N, where the N represents an integer between 2 and 10 in the preferred embodiment of the invention. Thus, up to 10 of the switching boards may be connected together, with each of the switching boards including 100 terminal points. In many applications, less than 10 switching boards will be required, so the number N can be less than 10.

A random access board 54 which provides the buses 0 and 1 may be plugged into the last switching board 52 through five connectors. The random access board 54 provides 10 terminal points. An additional random access board 56 may be connected with board 54 to provide an additional 100 terminal points. Up to 10 random access boards can be provided in a single switch module, and the number N indicated for board 56 may be any integer between 2 and 10, as 10 boards are not always required.

The slave switch modules 15 and 16 are constructed in a manner similar to what is shown in FIG. 3. However, the slave switch modules each provide four buses. The switch boards such as boards 50 and 52 are not required in the slave modules, as only the master module 12 has the input and output buses that are serviced by the switch boards. The slave switch modules 15 and 16 each provide four buses, and they each have up to 10 of the random access boards 54 and 56 so that a total of 1000 terminal points is provided in each of the slave switch modules.

As previously indicated, the modules may not require all 10 of the switch boards or all 10 of the random access boards. However, if additional termination points are required at a later time, they can be provided simply by adding one or more additional random access boards such as the boards 54 and 56.

FIG. 5 diagrammatically shows one of the random access boards. The board has a plurality of relay contacts which are collectively identified by numeral 58 and which are used to selectively connect bus 0 with selected front face connectors such as the connector 60 identified as FFC1 (first front face connector), the connector 62 identified as FFC2 (second front face connector), or the connector 64 identified as FFCN (the nth front face connector). Additional contacts 65 associated with bus 1 can be used to selectively connect bus 1 with the front face connectors such as the connectors 60, 62 and 64. For example, when the relay contacts identified as RA1 associated with bus 0 are closed, bus 0 is connected with the connector 60. The relay contacts 58 and 65 are selectively closed under program control in order to connect the desired bus with the desired front face connector. As previously indicated, each random access board is provided with 100 front face connectors, so each bus 0 and 1 may have up to 100 RA relay contacts. Thus, the last contacts (indicated as RAN for each bus) may be RA 100. However, a different number can be used.

The random access boards used in the slave switch modules 15 and 16 are arranged similarly to what is shown on FIG. 5. However, because they each service four different buses, each of the four buses may be switched to connection with any of the front face connectors. As previously indicated, all of the front face connectors may not require multiple buses, so some of the face connectors may be only connected with one bus. In this type of arrangement, each bus does not service all of the face connectors.

Figure 4:
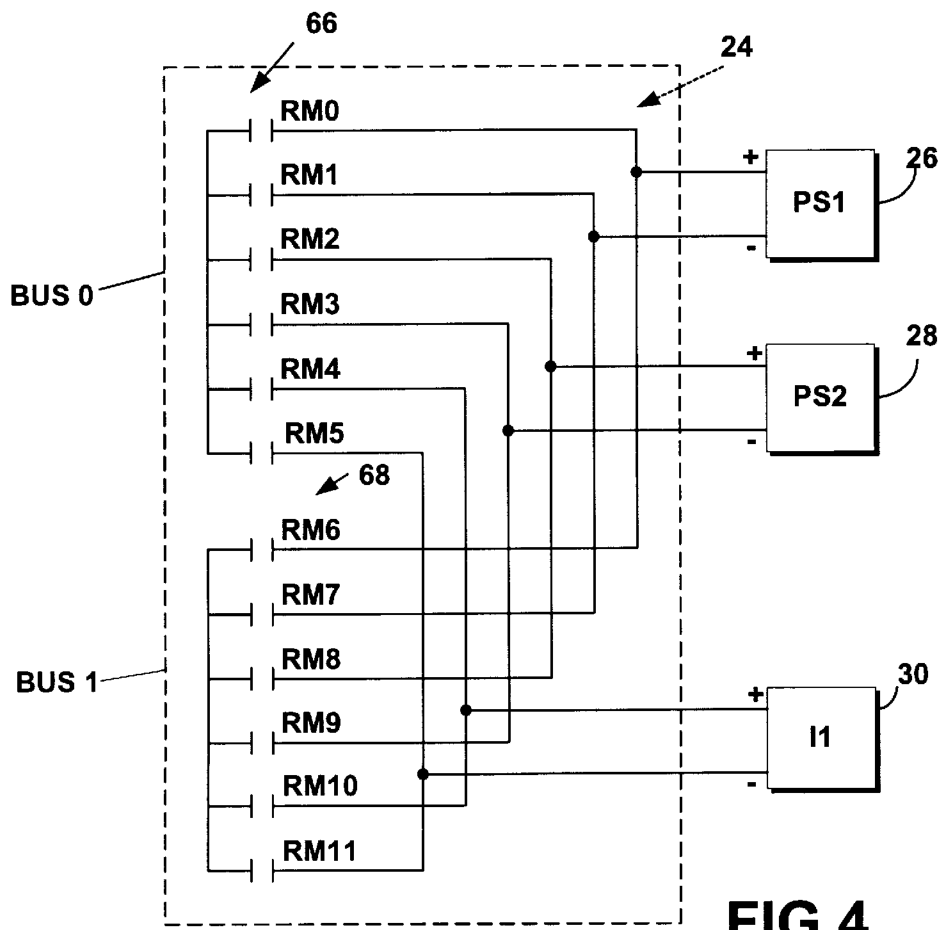
FIG. 4 is a schematic diagram of the routing matrix unit and how power supplies and instrumentation may be connected to the buses through the routing matrix system.

The details of the routing matrix unit 24 are shown in simplified form in FIG. 4. For each bus, the routing matrix unit 24 includes a plurality of relay contacts. For example, the contacts associated with bus 0 are collectively identified by numeral 66 in FIG. 4 and are designated RM0–RM5. Similarly, contacts 68 identified as RM6–RM11 are associated with bus 1. The sides of the relay contacts 66 and 68 opposite the sides that connect with the buses connect with power supplies and/or instrumentation. For example, FIG. 4 shows the positive terminal of power supply 26 connected with contacts RM0 and RM6, while the negative terminal of power supply 26 is connected with relay contacts RM1 and RM7. Additionally, power supply 28 may have its positive terminal connected with contacts RM2 and RM8 and its negative terminal connected with contacts RM3 and RM9. The instrument 30 which may be a volt meter or another type of electrical measuring device may be connected at one terminal with contacts RM4 and RM10 and at the other terminal with contacts RM5 and RM11. It should be evident that other instrumentation and power supplies can be connected with the routing matrix unit and that the connections can take different patterns.

With the connection scheme shown, either of the power supplies 26 and 28 and the instrument 30 can be connected with either of the buses. For example, by closing contacts RM0 and RM7, the positive terminal of power supply 26 can be connected with bus 0 and the negative terminal can be connected with bus 1. Another option is to close contacts RM6 and RM1 to connect the positive terminal of power supply 26 with bus 1 and the negative terminal with bus 0. Similar options are available for connecting the other power supply 28 and the instrument 30 with buses 0 and 1 as desired.

In this manner, the power supplies 26 and 28 can provide different voltages and can be used alternately in the testing operation to provide the required voltages. If only two power supplies and one instrument, or three power supplies, are required for the testing operation, only buses 0 and 1 are needed to make all of the power supplies and instrumentation available to all of the test points. Consequently, in this situation, only the master switch module 12 is necessary because it is able to serve both of the buses 0 and 1. However, if additional power supplies and/or instruments are required, one or more of the slave switch modules 15 and 16 is necessary to provide the additional bus capacity. The additional power supplies and/or instrumentation can be connected through the routing matrix unit 24 to the buses 2–9 in a manner similar to what is shown in FIG. 4.

The capacity of the routing matrix unit 24 depends upon the number of buses and thus the number of switch modules that are needed. Thus, if additional buses are required, the routing matrix unit 24 has additional contacts that are used to service the additional buses.

The multiple bus switching and testing system of the present invention can be used to carry out a variety of testing operations. By way of example, the relay depicted in FIG. 6 can be tested. The relay includes a relay coil 70 which has terminals J4 and J5 and which has a diode 72 connected across it. The relay has a common contact 74, a normally closed contact 76 which is connected with contact 74 in the deenergized state of the coil 70, and a normally open contact 78 which is connected with the common contact 74 when coil 70 is energized. The common contact 74 is connected with a terminal identified as J2 in FIG. 6, while contacts 76 and 78 are connected with terminals J1 and J3, respectively. A capacitor 80 may be connected across terminals J6 and J7 as shown.

The switching and testing system may be used to test the relay of FIG. 6 in accordance with the software which is depicted in simplified flow chart form in FIG. 7. As indicated in block 82, the entire switching system is reset as the initial step in the testing operation. Then, as indicated in block 84, the terminals of the power supplies are connected to the switch points of the routing matrix. For example, FIG. 4 shows the positive terminal of power supply 26 connected with the routing matrix switch points RM0 and RM6. The negative terminal of power supply 26 is connected with switching points RM1 and RM7. Similarly, the positive terminal of power supply two is connected with switch points RM2 and RM8, while the negative terminal of power supply two is connected with switch points RM3 and RM9. The instrument 30 may be connected on one side with switch points RM4 and RM10 and on the other side with switch points RM5 and RM11. Under program control, the RM switches are closed to connect the power supplies and instrumentation with the appropriate bus 0 or bus 1.

In block 86, the buses are defined to the routing matrix switch points. For example, with continued reference to FIG. 4, bus 0 may be defined to switch points RM0–RM5, and bus 1 may be defined to switch points RM6–RM11. Block 88 represents a procedure in which various circuits and components are tested for continuity and insulation. For example, the bottom side of the relay coil 70 (see FIG. 6) may be tested for a short circuit. Likewise, relay contacts 74 and 78 may be tested for short circuits. The normally closed contact 76 may be checked for continuity.

The coil resistance may be tested in block 90 to make certain that the resistance of coil 70 is within the established tolerances. The diode 72 may be checked in block 92 to make certain that its resistance in the forward direction is less than an established limit.

Actual testing of the operation of the relay is initiated in block 94 where the positive terminal of the first power supply 26 is connected to bus 1 by closing the routing matrix switch RM6. The negative terminal of the first power supply 26 is connected to bus 0 by closing the routing matrix switch RM1. In block 96, switch cell number 103 is connected to bus 0 and switch cell 211 is connected to bus 1. Because these switch cells are connected with the opposite sides of the relay coil 70 as shown in FIG. 6, the power supply 26 is applied across coil 70 through the two buses, bus 0 and bus 1. In block 98, switch cells 235 and 236 are checked to confirm closure of the normally open relay contact 78. Because switch cells 235 and 236 are connected with the normally open contact 78 and with the common contact 74, respectively, a resistance between these two switch cells that is less than an established threshold indicates that the normally open contact 78 has properly closed.

In block 100, switch cell 103 is disconnected from bus 0 and switch cell 211 is disconnected from bus one to deenergize the relay coil 70. Next, the switch cells 236 and 237 are checked in block 102 to confirm that the contacts 74 and 78 have released when coil 70 is deenergized. Again, a suitable resistance measurement can be made to confirm proper continuity between contacts 74 and 76.

The power supply 26 is then disconnected from buses 1 and 0 by opening the routing matrix switch points RM6 and RM1. All of the latching switching is reset in block 106 and the testing procedure then ends as indicated at block 108.

Additional testing can be accomplished by switching other power supplies such as the second power supply 28 to connection with bus 0 on one terminal and bus 1 on the other terminal, and then routing the buses through the appropriate RA relay switches to the front face connectors selected by the program. Instrumentation such as the instrument 30 can be similarly connected with the appropriate terminals of the unit under test to obtain meter readings and other measurements.

It is thus apparent that the switching and testing system makes use of the multiple buses (up to 10 buses if necessary) in order to provide ready access to power supplies and instrumentation used for testing of complicated electrical equipment such as relay panels and chassis. The system can be expanded in the field if necessary either by adding additional random access boards to the switch module or adding additional switch modules in order to provide additional buses. Because of the switching provided by the system of the present invention, there is no need to provide specialized split cables to make the required connections, and standard cables can be used in order to avoid undue cost and complexity of the connecting cables.

From the foregoing it will be seen that this invention is one well adapted to attain all ends and objects hereinabove set forth together with the other advantages which are obvious and which are inherent to the structure.

It will be understood that certain features and subcombinations are of utility and may be employed without reference to other features and subcombinations. This is contemplated by and is within the scope of the claims.

Since many possible embodiments may be made of the invention without departing from the scope thereof, it is to be understood that all matter herein set forth or shown in the accompanying drawings is to be interpreted as illustrative, and not in a limiting sense.

Having thus described the invention, what is claimed:

1. A system for allowing a plurality of instruments such as power supplies and meters to be coupled to a plurality of test points for testing of circuitry connected by wire to the test points, said system comprising:

a switching module having a plurality of buses and switching means for selectively connecting selected buses with selected test points, said test points operable to connect by wire to a circuit to be tested, wherein at least one selected test point is simultaneously connected to a plurality of said buses; and a switching matrix having one or more said instruments connected by wire and means for selectively switching said instruments with said buses to establish electrical connections of said instruments with test points selected by the conditions of said switching means.

2. In a testing system for selectively coupling instruments such as power supplies and meters to test points connected by wire to circuitry that is to be tested by the instruments, a modular multiple bus switching arrangement comprising:

a plurality of circuit boards each having a plurality of switches for selectively connecting selected test points with a plurality of buses to which the switches may be connected;

a switching module which includes between one and N of said circuit boards, where N is an integer greater than one, and wherein at least one test point is simultaneously connected with said plurality of buses; and a switching matrix having one or more said instruments connected by wire and means for selectively switching said instruments with said buses to establish electrical connections of said instruments with test points selected by the condition of the switches.

3. A modular multiple bus switching arrangement for a testing system for testing circuitry which is connected by wire with test points and which is tested by connecting it with instruments such as power supplies and meters, said switching arrangement comprising:

a first switching module which includes between one and N circuit boards each having a plurality of switches programmed to selectively connect the test points with a first plurality of buses served by said switching module, where N is an integer greater than one, and wherein at least one of said test points is simultaneously connected to at least two of said first plurality of buses;

a second switching module which includes between one and N additional circuit boards each having a plurality of switches programmed to selectively connect the test points with a second plurality of test of buses served by the second switching module; and a switching matrix having a one or more said instruments connected by wire and means for selectively switching said instruments with said buses to establish electrical connections of said instruments with test points selected by the condition of the switches.

4. The modular multiple bus switching arrangement as recited in claim 3, wherein at least one of said test points is simultaneously connected to at least two of said second plurality of buses.

* * * * *